United States Patent
Boyd et al.

(10) Patent No.: US 12,526,965 B2
(45) Date of Patent: Jan. 13, 2026

(54) HEAT EXCHANGER ASSEMBLY

(71) Applicant: VALEO SYSTEMES THERMIQUES, La Verriere (FR)

(72) Inventors: Donald Boyd, Auburn Hills, MI (US); David Troy, Auburn Hills, MI (US); Andrew Draper, Auburn Hills, MI (US); Bertrand Cerru, Auburn Hills, MI (US); Allen Skowron, Auburn Hills, MI (US); Justyna Bogiel, Auburn Hills, MI (US); Paul Burke, Auburn Hills, MI (US)

(73) Assignee: Valeo Systemes Thermiques, La Verriere (FR)

( * ) Notice: Subject to any disclaimer, the term of this patent is extended or adjusted under 35 U.S.C. 154(b) by 109 days.

(21) Appl. No.: 18/167,553

(22) Filed: Feb. 10, 2023

(65) Prior Publication Data

US 2024/0179880 A1 May 30, 2024

Related U.S. Application Data

(60) Provisional application No. 63/385,457, filed on Nov. 30, 2022.

(51) Int. Cl.
*H05K 7/20* (2006.01)

(52) U.S. Cl.
CPC ......... *H05K 7/20872* (2013.01); *H05K 7/205* (2013.01)

(58) Field of Classification Search
CPC .............................. F28F 3/12; H05K 7/20872
USPC ........................................................ 361/689
See application file for complete search history.

(56) References Cited

U.S. PATENT DOCUMENTS

| | | | |
|---|---|---|---|
| 9,648,783 B1 * | 5/2017 | Liu | H05K 9/0088 |
| 2006/0012034 A1 | 1/2006 | Kadoya et al. | |
| 2013/0029506 A1 * | 1/2013 | Zhou | G01R 1/0466 |
| | | | 439/136 |
| 2018/0252479 A1 * | 9/2018 | Kenney | F28F 9/0243 |
| 2018/0261526 A1 * | 9/2018 | Machler | H01L 23/473 |
| 2021/0195807 A1 | 6/2021 | Klink et al. | |

FOREIGN PATENT DOCUMENTS

| | | | | |
|---|---|---|---|---|
| CN | 202378814 U | | 8/2012 | |
| CN | 110463369 A | * | 11/2019 | ............ B29C 45/14 |
| CN | 114867980 A | * | 8/2022 | ............ F28D 1/0316 |
| DE | 112014004930 B4 | * | 11/2017 | ............ B23P 15/26 |

(Continued)

OTHER PUBLICATIONS

Divyanshi Tewari et al., "Automotive Integrated Circuit (ICs) Market Share, Trends—2030", Jul. 2018, Allied Market Research, p. 3. (Year: 2018).*

(Continued)

*Primary Examiner* — Mandeep S Buttar
*Assistant Examiner* — Kyle Oxenknecht
(74) *Attorney, Agent, or Firm* — Valeo Systemes Thermiques

(57) ABSTRACT

A heat exchanger assembly, including a heat exchanger with a primary tube including a first fluid channel for a heat exchange fluid; a first heat source module with a plurality of first heat sources; an attachment with a plurality of contact portions exposed to the plurality of first heat sources, mounted on the primary tube adjacent to the first fluid channel.

20 Claims, 14 Drawing Sheets

(56) References Cited

FOREIGN PATENT DOCUMENTS

| EP | 3471523 A1 | 4/2019 | |
|---|---|---|---|
| KR | 950007664 U | 3/1995 | |
| TW | 201509288 A * | 3/2015 | ................ F28F 3/12 |
| WO | WO-2014090641 A1 * | 6/2014 | ......... B60H 1/00278 |
| WO | 2022192031 A1 | 9/2022 | |
| WO | 2022245740 A1 | 11/2022 | |
| WO | 2023283076 A1 | 1/2023 | |

OTHER PUBLICATIONS

European Patent Office, International Search Report (with English translation) and Written Opinion of corresponding PCT Application No. PCT/EP2023/083607, dated Feb. 19, 2024, 12 pages.

\* cited by examiner

HEAT EXCHANGER ASSEMBLY

TECHNICAL FIELD

The invention relates to a heat exchanger assembly, in particular to a heat exchanger assembly for an electronic control unit, applicable in automotive field.

BACKGROUND OF THE INVENTION

Electronic control units are known to require thermal management. Integrated circuits, or other electronic or electric components, generate heat during operation. In case of integrated circuits, the power is dissipated on a small surface. The heat generated this way needs to be effectively evacuated, especially when the components operate under high loads. High performance units require dedicated cooling devices to enable their effective operation. One known way of addressing the issue is to utilize air for direct cooling of the heat sources.

Automotive industry increasingly depends on high performance electronic control units to ensure safe and effective operation of vehicles. More and more of electronic control units, in various forms and configurations, are utilized to perform functions such as controlling the vehicle's battery systems, handling the driver assistance systems or performing autonomous driving function.

There is a need to provide an effective heat exchange solution, which could be used for thermal management of an electronic control unit, in particular one used in a vehicle.

SUMMARY OF THE INVENTION

The object of the invention is, among others, a heat exchanger assembly, comprising a heat exchanger with a primary tube including a first fluid channel for a heat exchange fluid; a first heat source module with a plurality of first heat sources; an attachment with a plurality of contact portions exposed to the plurality of first heat sources, mounted on the primary tube adjacent to the first fluid channel.

In one embodiment, the first heat source module is a PCB board, the first heat sources 401 being integrated circuits.

In one embodiment, the heat exchanger assembly is further comprising a chassis to which the heat exchanger and the first heat source module are attached.

In one embodiment, the chassis includes a housing defining an internal volume in which the first heat source module is located.

In one embodiment, the primary tube is located externally with respect to the housing 501.

In one embodiment, the housing has a primary slot for the primary tube at least partially enveloping the primary tube.

In one embodiment, the housing has a primary separation wall between the primary tube and the first heat source module, wherein the primary separation wall includes a primary attachment opening through which the attachment protrudes.

In one embodiment, the heat exchanger assembly is further comprising a second heat source module with a second heat source, in contact with the primary tube, wherein the primary tube is sandwiched between the first heat source module and the second heat source module.

In one embodiment, the primary tube includes a first flat plate and a first shaped plate connected to each other to form a first fluid channel, wherein the second heat source module is abutting the first flat plate.

In one embodiment, the second heat source module is in form of a cartridge encapsulating the second heat source.

In one embodiment, the second heat source is an integrated circuit.

In one embodiment, the second heat source module is attached to the chassis externally with respect to the housing.

In one embodiment, the heat exchanger includes a terminal tube including a second fluid channel for a heat exchange fluid, connected fluidically to the primary tube.

In one embodiment, the heat exchanger assembly is further comprising a third heat source module with a plurality of third heat sources.

In one embodiment, the heat exchanger assembly is further comprising a fourth heat source module with a fourth heat source, in contact with the terminal tube, wherein the terminal tube is sandwiched between the third heat source module and the fourth heat source module.

In one embodiment, the terminal tube is located externally with respect to the housing.

In one embodiment, the housing has a terminal slot for the terminal tube at least partially enveloping the terminal tube.

In one embodiment, the terminal tube includes an attachment with a plurality of contact portions exposed to the plurality of third heat sources, mounted on the terminal tube adjacent to the second fluid channel.

In one embodiment, the housing has a terminal separation wall between the terminal tube and the third heat source module, wherein the terminal separation wall includes a terminal attachment opening through which the attachment of the terminal tube protrudes.

In one embodiment, wherein the primary tube and the terminal tube are connected by an interconnector enabling fluid flow therebetween, wherein the housing has an interconnector cut-out at least partially enveloping the interconnector.

BRIEF DESCRIPTION OF DRAWINGS

The present invention will be described in greater detail below with reference to the drawings. In the drawings.

DETAILED DESCRIPTION OF THE INVENTION

Figure 1:
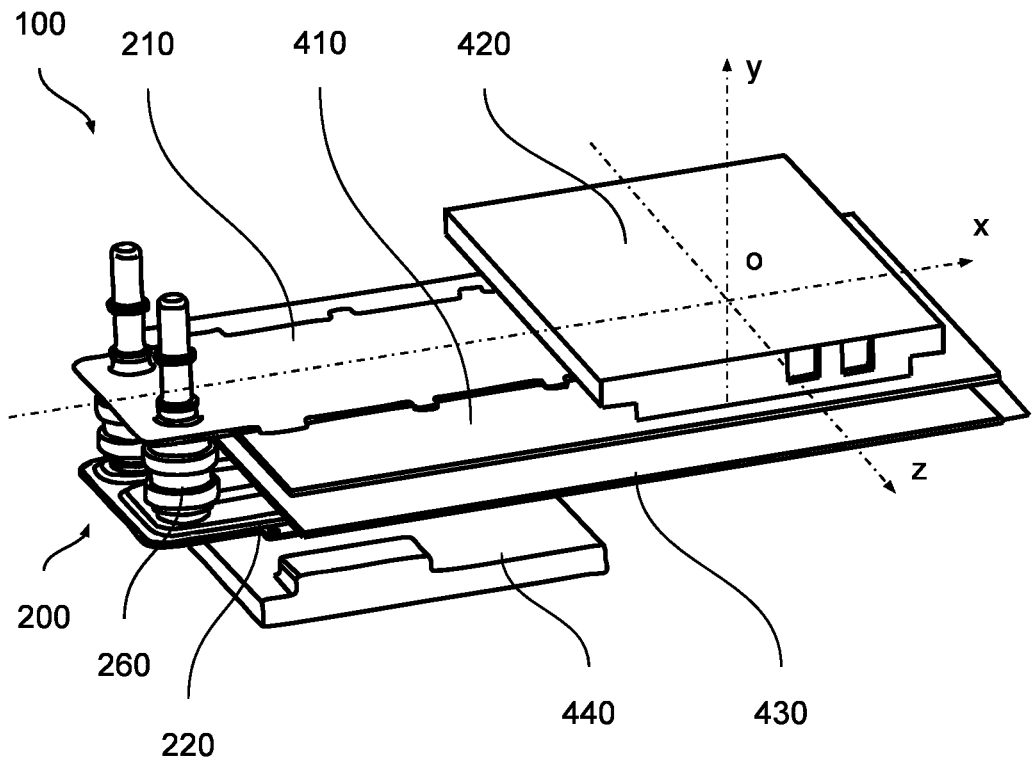
FIG. 1 shows a heat exchanger assembly with heat source modules in a perspective view.
Figure 2:
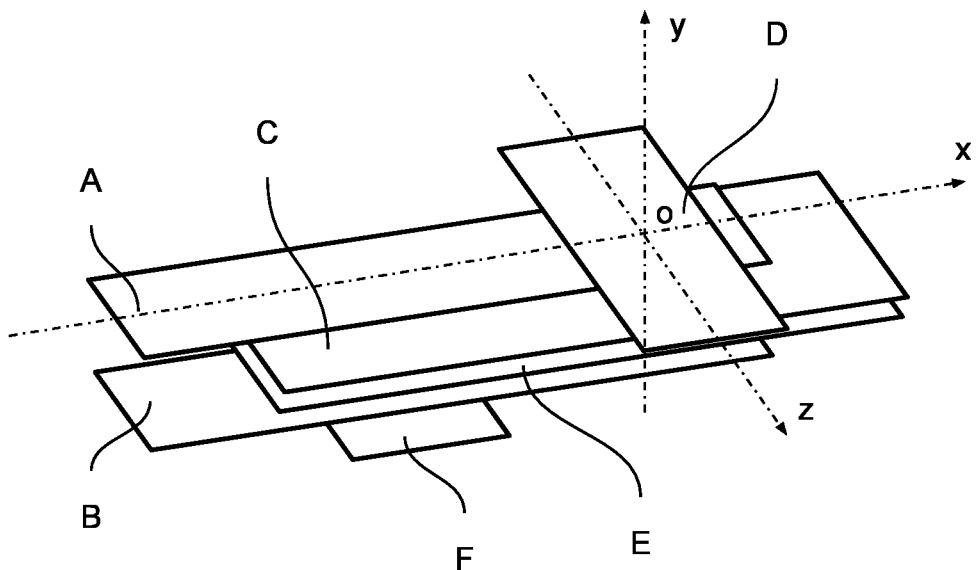
FIG. 2 shows schematically extension planes of select heat exchanger assembly components.

In order to simplify the description of the invention, a Cartesian reference is formed (o, x, y, z), and the direction o-x is defined as being the direction of the length, o-y is the direction of the height, and o-z is the direction of the width, as shown in FIGS. 1 and 2.

FIG. 1 shows a heat exchanger assembly 100 with a heat exchanger 200 and a plurality of heat source modules 410, 420, 430, 440 in a perspective view. The heat exchanger 200 includes a primary tube 210 for a heat exchange fluid. The heat exchange fluid flows through the heat exchanger 200, in particular through the primary tube 210, and enables heat exchange between the heat exchanger 200 and any heat sources in contact with it. The heat exchange fluid can be a refrigerant (such as R134A, R-1234YF or R744) or a coolant (e.g. glycol-water mixture).

The heat exchanger 200 can further include a terminal tube 220 for a heat exchange fluid, connected fluidically to the primary tube 210. The primary tube 210 and the terminal tube 220 can be connected by one or more interconnectors 260 enabling fluid flow therebetween.

The heat exchanger assembly 100 includes at least a first heat source module 410. In the embodiment shown in FIG. 1, the heat exchanger assembly 100 includes the first heat source module 410, a second heat source module 420, a third heat source module 430 and a fourth heat source module 440.

The first heat source module 410 abuts the primary tube 210, so that heat from the first heat source module 410 can be dissipated to the primary tube 210.

In the shown embodiment, the first and second heat source modules 410, 420 abut the primary tube 210. The terminal tube 220 is abutted by the third and fourth heat source modules 430, 440. In other words, the primary tube 210 is sandwiched between the first and second heat source modules 410, 420, while the terminal tube 220 is sandwiched between the third heat source module 430 and the fourth heat source module 440. By the term "sandwiched" it is meant that the primary tube 210 and terminal tube 220 are in contact with and are located between respective heat source modules, taking into account presence of any thermal paste that could be used between their surfaces to improve heat exchange.

FIG. 2 shows schematically examples of extension planes of select components of the heat exchanger assembly 100. The primary tube 210 extends within a primary tube extension plane A. The terminal tube 220 extends within a terminal tube extension plane B. The first heat source module 410 extends within a first heat source module extension plane C. The second heat source module 420 extends within a second heat source module extension plane D. The third heat source module 430 extends within a third heat source module extension plane E. The fourth heat source module 440 extends within a fourth heat source module extension plane F. By "extension within an extension plane", it is meant here that two dimensions of the three-dimensional component are significantly greater than the third dimension, where the two dimensions are measured within said extension plane. The third dimension is measured perpendicular to the extension plane. In other words, a component extending within an extension plane is a generally flat component, the height of which is relatively small compared to its width and length. Preferably, all extension planes A, B, C, D, E and F extend in parallel to each other.

In the shown embodiment, the primary tube 210 and the terminal tube 220 extend predominantly along axis X and to a lesser degree along axis Z, meaning their length is greater than their width. Their height is substantially smaller than the two other dimensions.

The first heat source module 410 and the third heat source module 430 similarly extend predominantly along axis X and to a lesser degree along axis Z, meaning their length is greater than their width. Their height is substantially smaller than the two other dimensions.

The second heat source module 420 and the fourth heat source module 440 extend predominantly along axis Y and to a lesser degree along axis Z, meaning their width is greater than their length (the opposite arrangement is also envisaged). Their height is substantially smaller than the two other dimensions.

It should be noted that there can be a plurality of the second heat source modules 420 arranged along the primary tube 210, as well as a plurality of fourth heat source modules 440 arranged along the terminal tube 220. Similarly, a plurality of the first heat source modules 410 and the third heat source modules 430 could be arranged along the primary and terminal tubes 210, 220, depending on the configuration of the unit.

Figure 3:
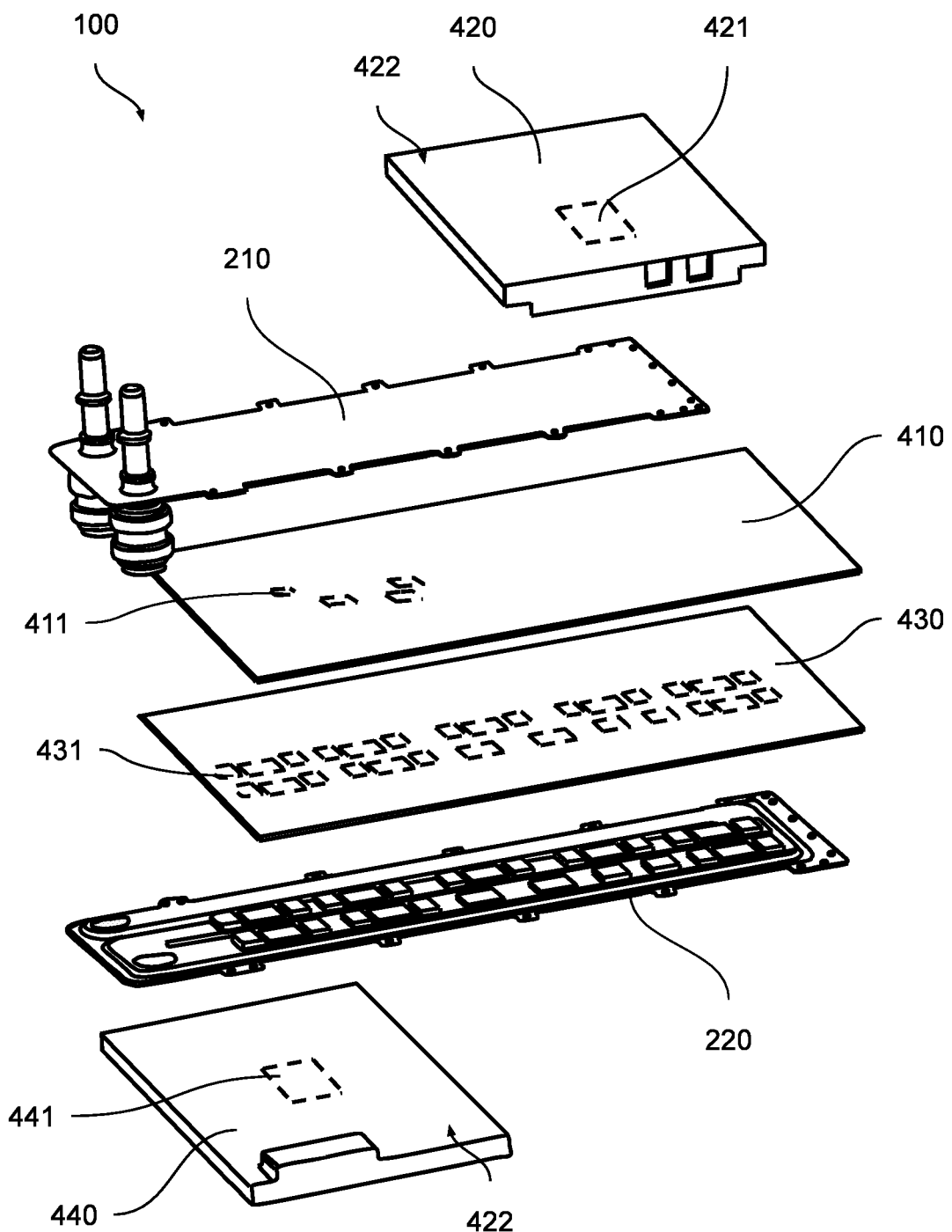
FIG. 3 shows a heat exchanger assembly of FIG. 1 in an exploded view.

FIG. 3 shows a heat exchanger assembly 100 of FIG. 1 in an exploded view. The first heat source module 410 includes at least one first heat source 411. In the shown embodiment, the first heat source module 410 includes a plurality of first heat sources 411. Preferably, the plurality of first heat sources 411 extends parallel to the predominant extension axis of the primary tube 210 so that this single primary tube 210 can address the heat exchange needs of the whole first heat source module 410. In one embodiment, the first heat source module 410 is a PCB board. The first heat sources 411 can be individual integrated circuits.

The second heat source module 420 includes at least one second heat source 421.

Figure 8:
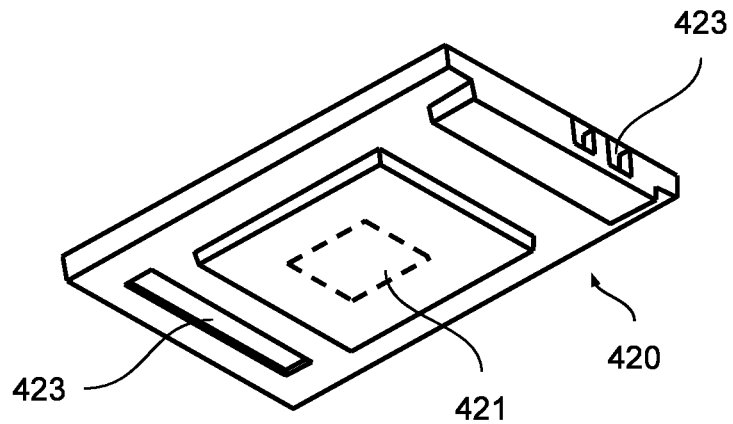
FIG. 8 shows a heat source module in form of a cartridge in a perspective view from the bottom.

In the shown embodiment, the second heat source module 420 is in form of a cartridge 422, as it will be shown in detail in FIG. 8. In one embodiment, the second heat source module 420 is in form of a cartridge 422 in which a PCB board with at least one integrated circuit is located.

The third heat source module 430 includes at least one third heat source 431. In the shown embodiment, the third heat source module 430 includes a plurality of third heat sources 431. Preferably, the plurality of the third heat sources 411 extends parallel to the predominant extension axis of the terminal tube 220 so that this single terminal tube 220 can address the heat exchange needs of the whole third heat source module 430. In one embodiment, the third heat source module 430 is a PCB board. The third heat sources 431 can be integrated circuits.

The fourth heat source module 440 includes at least one fourth heat source 441. In one embodiment, the fourth heat source module 440 is in form of a cartridge 422 in which a PCB board with at least one integrated circuit is located.

Figure 4:
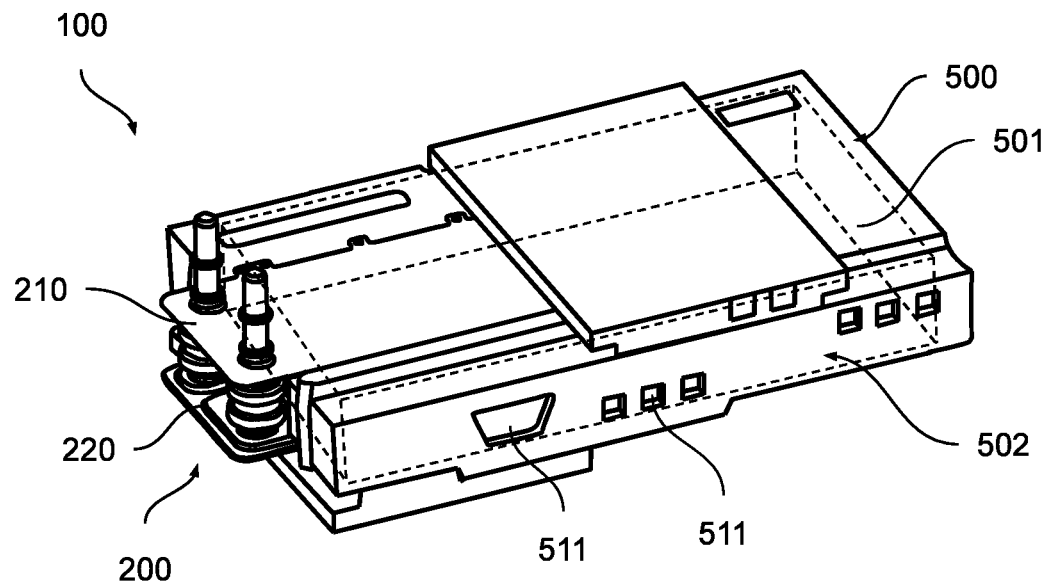
FIG. 4 shows a heat exchanger assembly in a perspective view.
Figure 5:
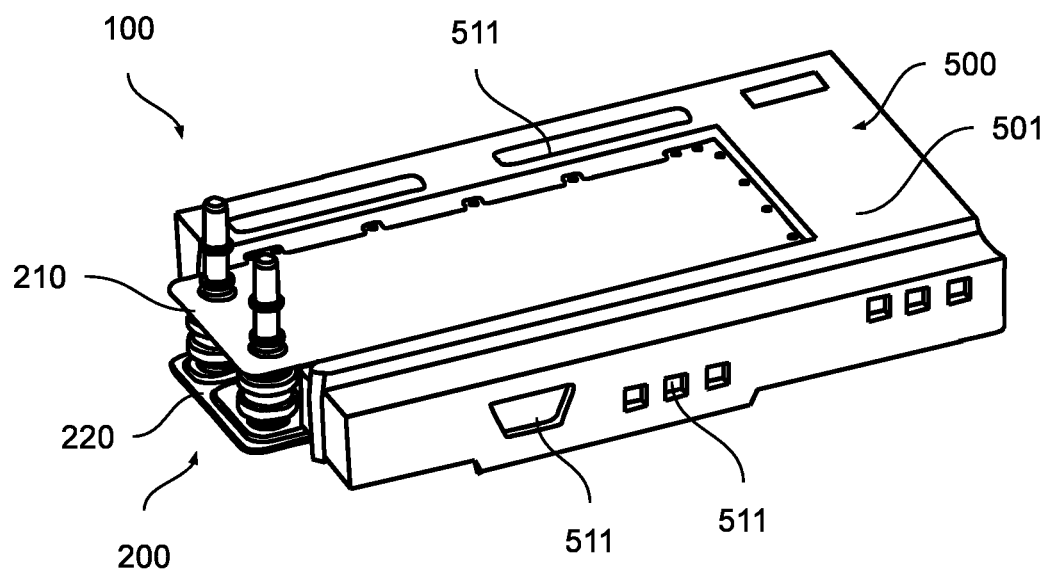
FIG. 5 shows a chassis with a heat exchanger in a perspective view.

FIG. 4 and FIG. 5 respectively show a heat exchanger assembly 100 and a chassis 500 with a heat exchanger 200 in a perspective view. The heat exchanger assembly 100 can include a chassis 500 serving as a mounting point for all the components, as well as enabling integration of the heat exchanger assembly 100 to other structures, such as a dedicated rack or a vehicle structure.

The chassis 500 preferably includes a housing 501, which can define an internal volume 502. The first heat source module 410 can be located within the internal volume 502. Preferably, the third heat source module 430 is also located inside the internal volume 502. The chassis 500 with the housing 501 allows to have the first and third heat source modules 410, 430 in form of PCBs without other protective arrangements, as the housing 501 can be configured to constitute a standalone enclosure protecting the internal components from outside detrimental factors as moisture, debris or moving elements of the vehicle. The housing 501 can include housing apertures 511 enabling connectors (not shown) of the first and third heat source modules 410, 430 to be exposed so that they can be connected to external signal and/or power lines, as well as connection between the second and fourth heat source modules 420, 440 to the components located inside of the housing 501.

In the shown embodiment, the primary tube 210 is located externally with respect to the housing 501. The terminal tube 220 can be located externally with respect to the housing 501 as well. Consequently, any heat source modules external to the housing 501 can also be cooled by the heat exchanger 200 of the heat exchanger assembly 100. In particular, the second heat source module 420 can be attached to the chassis 500 externally with respect to the housing 501. Similarly, the fourth heat source module 440 can be attached to the chassis 500 externally with respect to the housing 501.

Figure 6:
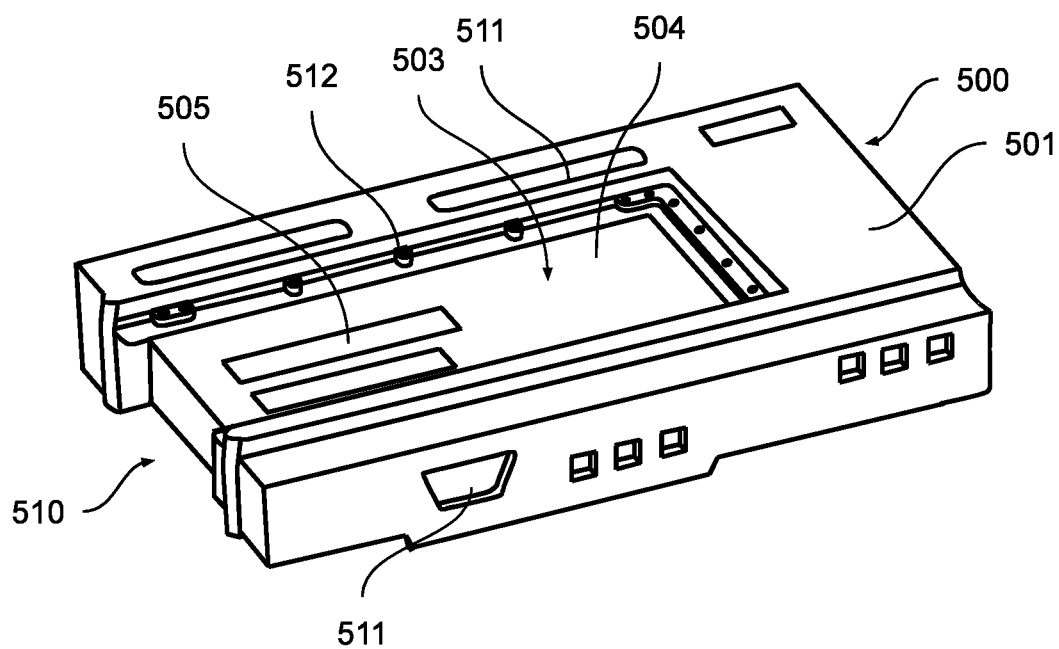
FIG. 6 shows a chassis in a perspective view from above.
Figure 7:
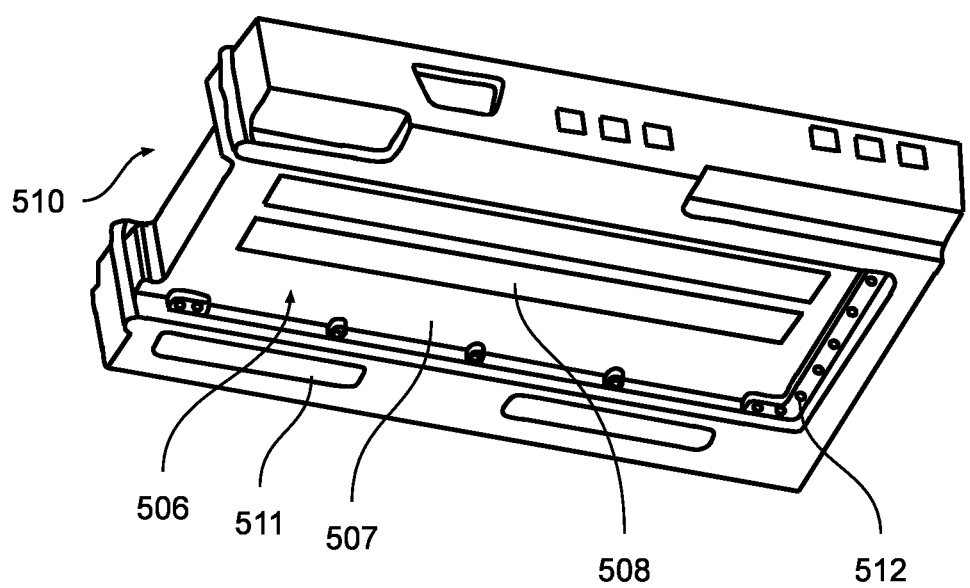
FIG. 7 shows a chassis in a perspective view from below.

FIG. 6 and FIG. 7 respectively show the chassis 500 without the heat exchanger 200 in a perspective view from above and below. The housing 501 of the chassis 500 can include a primary slot 503 for the primary tube 210. The primary slot 503 can at least partially envelop the primary tube 210. In other words, the primary slot 503 constitutes a depression within the housing 501 in which the primary tube 210 can be placed. The top portion of the primary tube 210 can thus be flush with the housing 501. The primary slot 503 allows providing a compact assembly, in particular when the second heat source 420 is also attached to the housing 501 of the chassis 500 as shown above.

The housing 501 can have a primary separation wall 504 between the primary tube 210 and the first heat source module 410. As explained in detail in relation to further figures, the heat exchanger 200 can include attachments 300 attached to and protruding substantially perpendicularly from the primary tube 210 and/or the terminal tube 220. In such case, the primary separation wall 504 can include at least one primary attachment opening 505 through which such attachment 300 protrudes. In the shown embodiment, there are two attachments 300 placed on the primary tube 210. Consequently, there are two primary attachment openings 505 as well. The two primary attachment openings 505 can be of different sizes to accommodate differently sized attachments 300.

In one embodiment, the housing 501 has an interconnector cut-out 510 at least partially enveloping one or more interconnectors 260 extending between the primary tube 210 and the terminal tube 220. In other words, the interconnector cut-out 510 constitutes a depression within the housing 501 in which said one or more interconnectors 260 can be placed. This allows improving compactness of the assembly.

As shown in FIG. 7, the housing 501 can have a terminal slot 506 for the terminal tube 220, which can at least partially envelope the terminal tube 220 analogously to the primary slot 503 in relation to the primary tube 210.

The housing 501 can have a terminal separation wall 507 between the terminal tube 220 and the third heat source module 430. The terminal separation wall 507 can include one or more terminal attachment openings 508 through which any attachment 300 of the terminal tube 220 can protrude. The terminal attachment openings 508 can be of different sizes to accommodate differently sized attachments 300.

Figure 18:
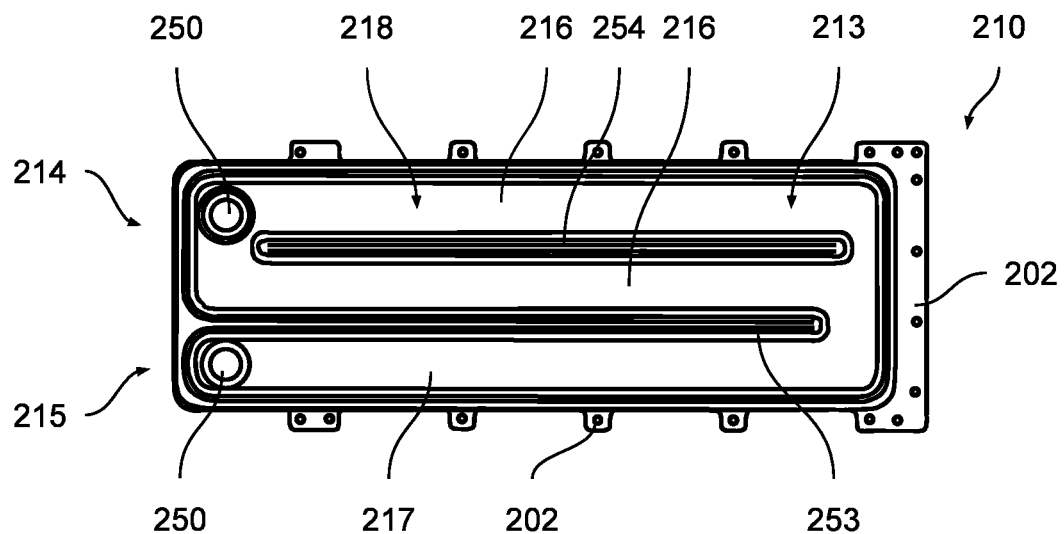
FIG. 18 shows an example of a primary tube.
Figure 19:
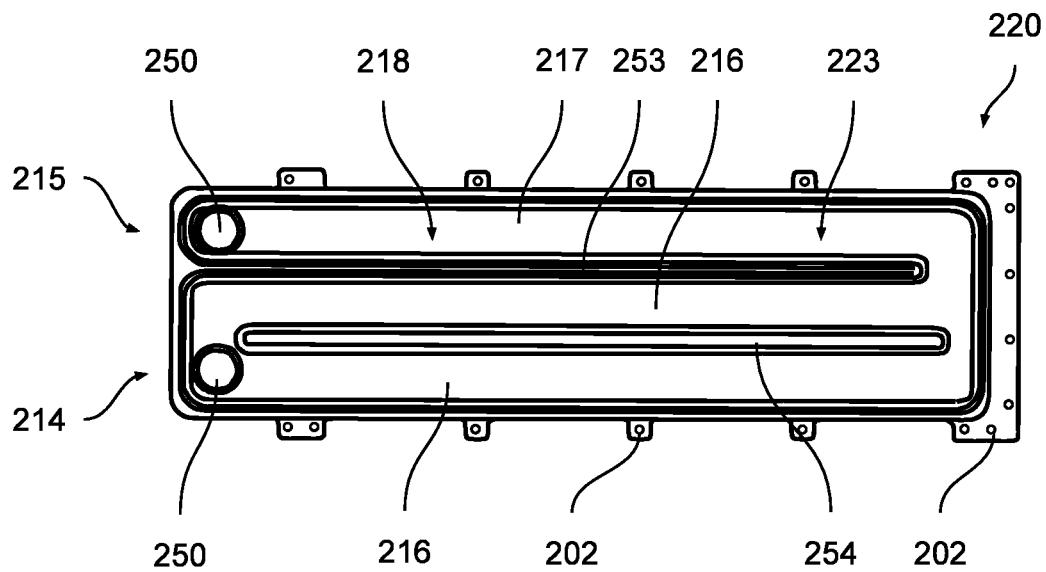
FIG. 19 shows an example of a terminal tube.

The housing 501 can include housing attachment points 512 to enable direct fixation of the primary tube 210 and terminal tube 220 if needed. For example, the housing attachment points 512 can be in form of a base with opening for a screw, while the primary and terminal tubes 210, 220 can have corresponding tube attachment tabs 202 (as shown in FIGS. 18, 19) with openings as well so that the components can be fixed together by means of screws.

FIG. 8 shows a heat source module, in this case the second heat source module 420, in form of a cartridge 422 in a perspective view from the bottom. The second heat source module 420 includes a second heat source 421, for example a PCB board with one or more integrated circuits. In the shown embodiment, the second heat source module 420 encapsulates the second heat source 421. The cartridge 422 can be a case defining a closed volume inside of which the second heat source 421 is located. Cartridge apertures 423 can be provided to enable connecting the second heat source module 420 to other components of the chassis 500 or external signal or power lines.

Figure 9:
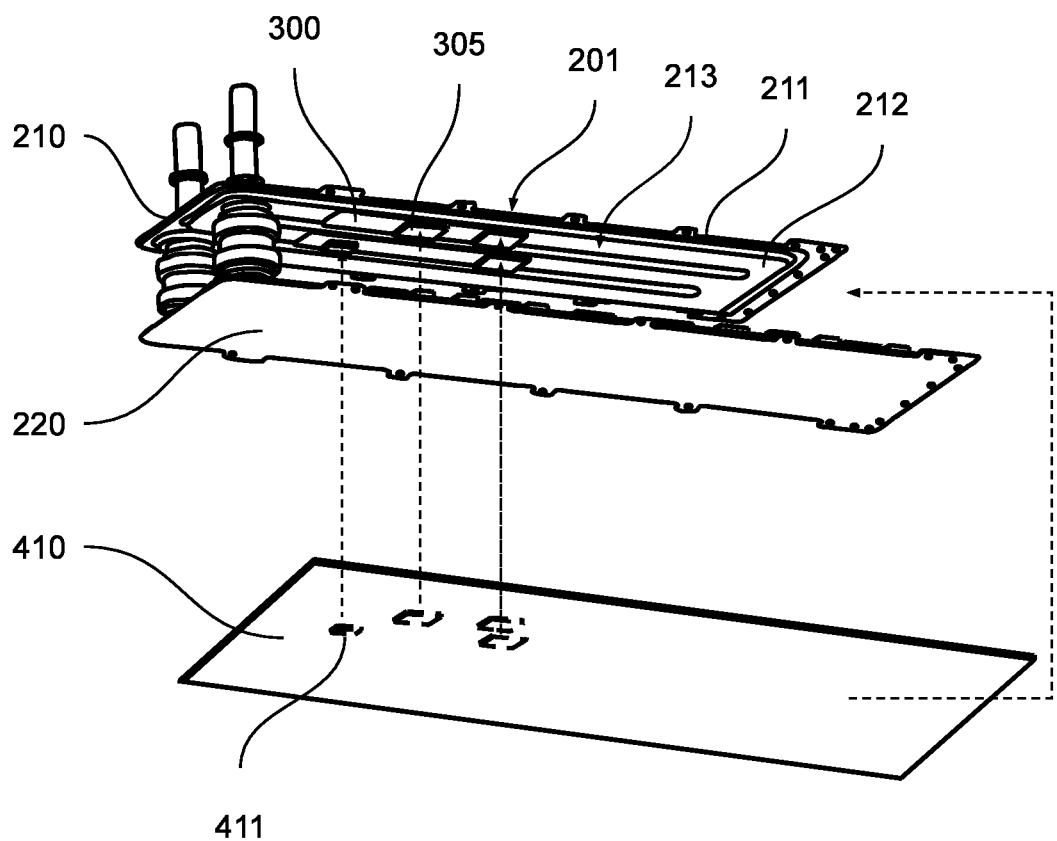
FIG. 9 shows a heat exchanger and a heat source module in an exploded view.

FIG. 9 shows a heat exchanger 200 and a heat source module, in this case the first heat source module 410, in an exploded view from below. The first heat source module 410, with a plurality of the first heat sources 411 is placed between the primary tube 210 and the terminal tube 220, in contact with the primary tube 210. The primary tube 210 can be made of heat exchange plates 201. In the shown embodiment, the primary tube 210 includes a first flat plate 211 (as better seen in FIG. 10) and a first shaped plate 212 connected to each other to form a first fluid channel 213 for the heat exchange fluid. In general, by a flat plate it is meant a plate which is generally flat and contributes to formation of any fluid channel by its flat portion. Since the primary tube 210 includes attachments 300 with contact portions 305 for ensuring direct contact with first heat sources 411, an effective heat exchange can be provided. The second heat source module 420 can be abutting the first flat plate 211 so that heat dissipated from it can be received by the primary tube 210.

Figure 10:
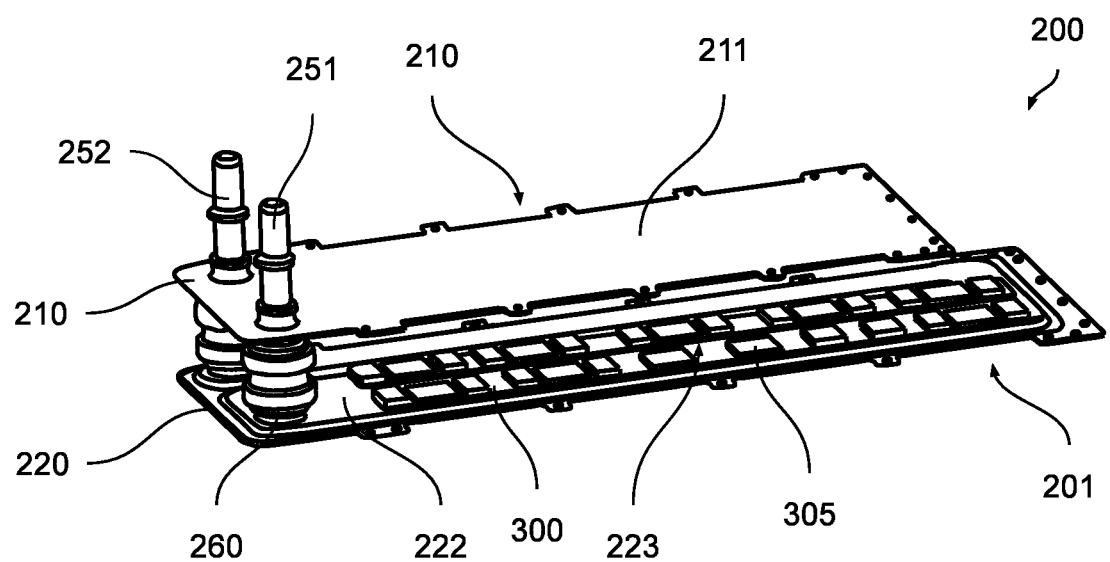
FIG. 10 shows a heat exchanger in a perspective view from above.
Figure 11:
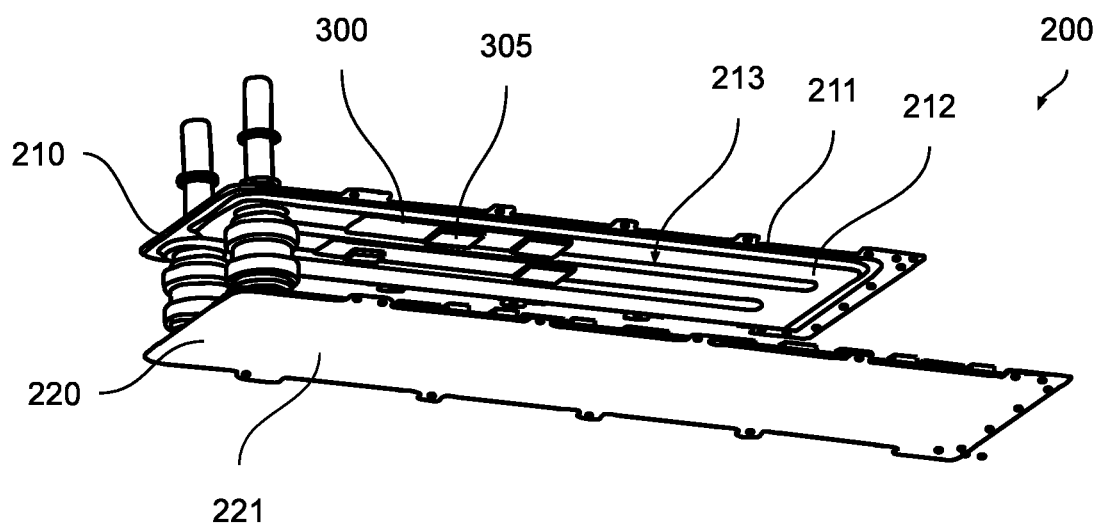
FIG. 11 shows a heat exchanger in a perspective view from below.

FIGS. 10 and 11 respectively show the heat exchanger 200 in a perspective view from above and below. The terminal tube 220 can be made of heat exchange plates 201. In the shown embodiment, the terminal tube 220 includes has a second flat plate 221 and a second shaped plate 222 connected to each other to form a second fluid channel 223.

The first and second flat plates 211, 221 and the first and second shaped plate 212, 222 include fluid openings 250 (as better seen in FIGS. 18, 19) to enable fluid flow to and from the primary and terminal tubes 220. In such case, the interconnectors 260 can connect respective openings 250.

The heat exchanger 200 can include an inlet spigot 251 and an outlet spigot 252. Preferably, the inlet spigot 251 and the outlet spigot 252 are attached to the first flat plate 211.

Preferably, the terminal tube 220 includes one or more attachments 300 with a plurality of contact portions 305 exposed to the plurality of third heat sources 431. The attachments can be mounted on the terminal tube 220 adjacent to the second fluid channel 223.

In the shown embodiment, the first shaped plate 212 and the second shaped plate 222 face each other.

Figure 12:
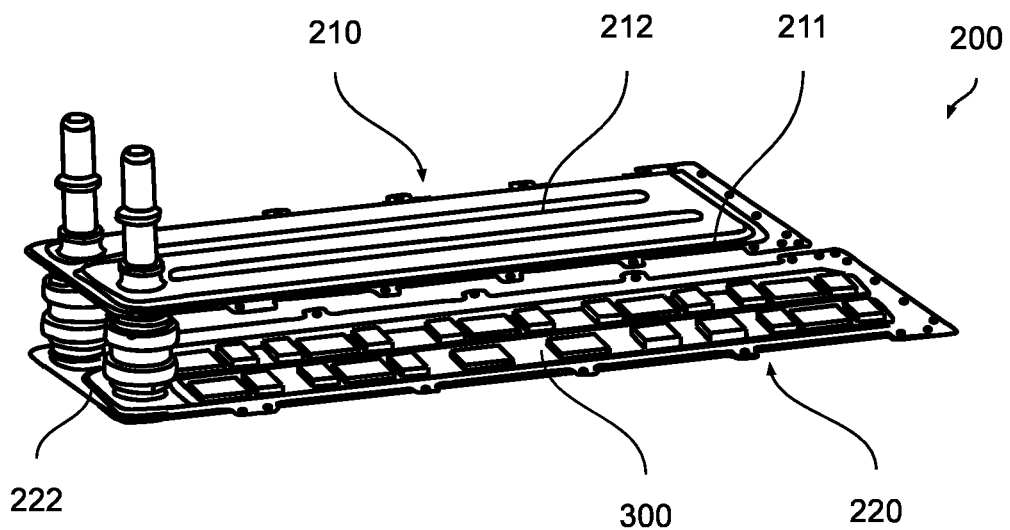
FIG. 12 shows another example a heat exchanger in a perspective view from above.

FIG. 12 shows another example a heat exchanger 200 in a perspective view from above, where the first shaped plate 212 faces away from the second shaped plate 222. Any of the first flat plate 211, the first shaped plate 212, the second flat plate 221 and the second shaped plate 222 can have one or more attachments 300 fixed thereto, depending on heat exchange needs and placement of specific heat sources. In this case, the first flat plate 211 and the second shaped plate 222 are equipped with attachments 300 to facilitate heat exchange with individual heat sources to be located in-between the primary tube 210 and the terminal tube 220.

Figure 13:
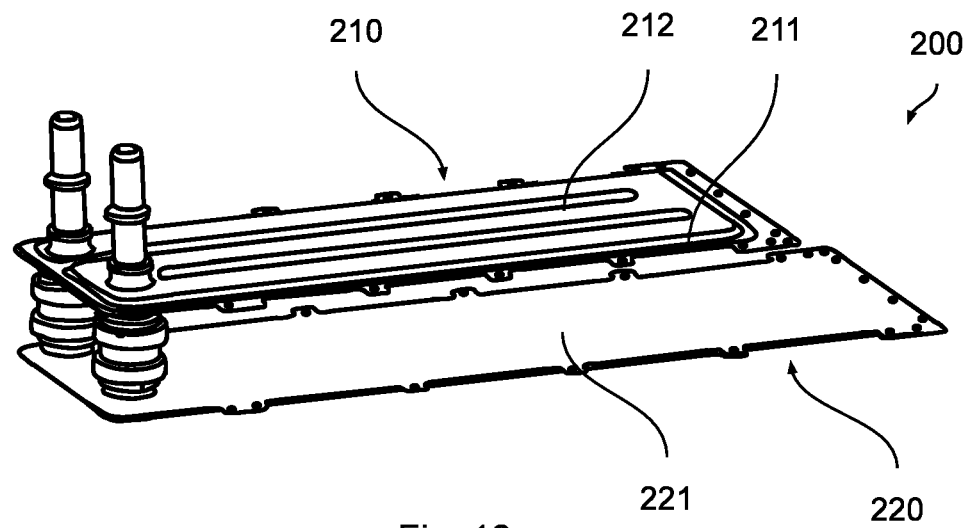
FIG. 13 shows another example a heat exchanger in a perspective view from above.

FIG. 13 shows another example a heat exchanger 200 in a perspective view from above, where the first flat plate 211 and the second flat plate 221 face each other. Any of the first flat plate 211, the first shaped plate 212, the second flat plate 221 and the second shaped plate 222 can have one or more attachments 300 fixed thereto, depending on heat exchange needs and placement of specific heat sources.

Figure 14:
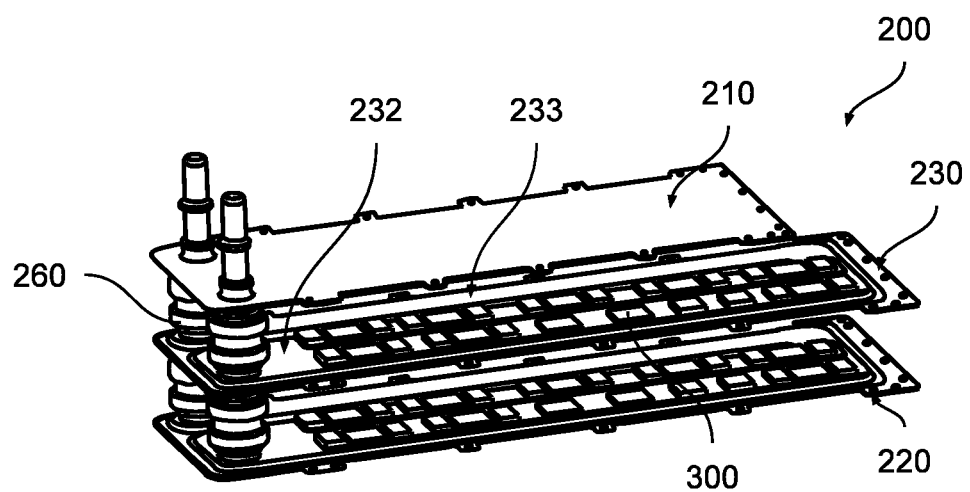
FIG. 14 shows another example a heat exchanger in a perspective view from above.
Figure 15:
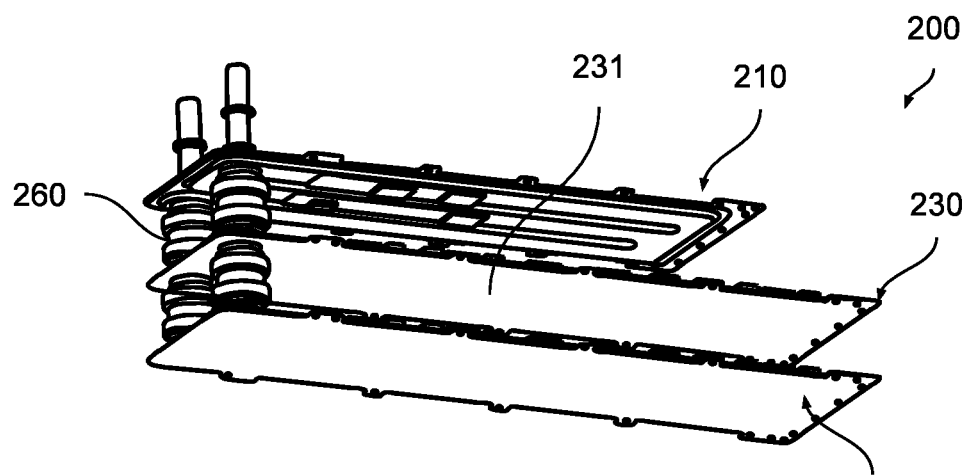
FIG. 15 shows another example a heat exchanger in a perspective view from below.

FIGS. 14 and 15 show another example a heat exchanger 200 in a perspective view respectively from above and below. The heat exchanger 200 can include an intermediate tube 230 arranged between the primary tube 210 and the terminal tube 220, connected to them by interconnectors 260. The intermediate tube 230 can include a third flat plate 231 and a third shaped plate 232 connected to each other to form a third fluid channel 233, wherein the third flat plate 231 and the third shaped plate 232 include fluid openings 250 to enable fluid flow to and from the intermediate tube 230. An attachment 300 can be used for the intermediate tube 230 in a same manner as for the primary tube 210 and the terminal tube 220. In any case, the intermediate tube 230 can have an analogous structure to the primary tube 210 and/or the terminal tube 220. There can also be a plurality of the intermediate tubes 230 between the primary tube 210 and the terminal tube 220.

In the shown example, the third shaped plate 232 faces the first shaped plate 212 and faces away from the second shaped plate 222.

Figure 16:
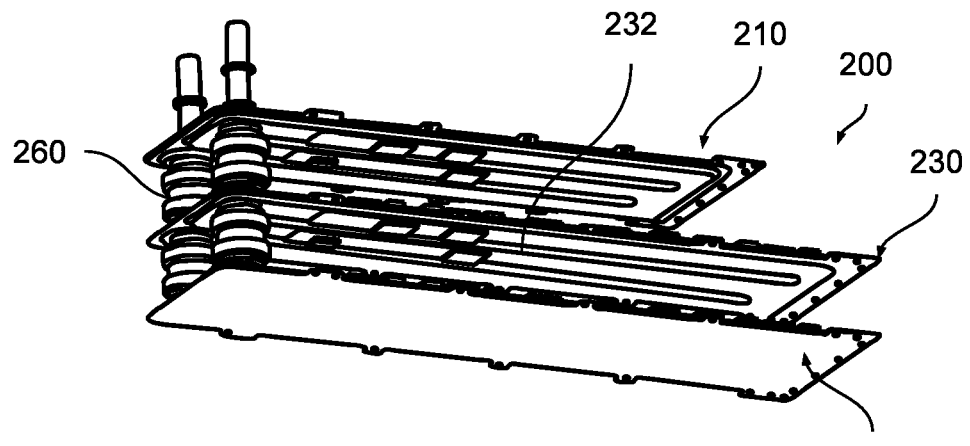
FIG. 16 shows another example a heat exchanger in a perspective view from below.

FIG. 16 shows another example a heat exchanger 200 in a perspective view from below. Compared to the example of the heat exchanger 200 of FIGS. 14 and 15, here the third shaped plate 232 faces the second shaped plate 222 and faces away from the first shaped plate 212.

Figure 17:
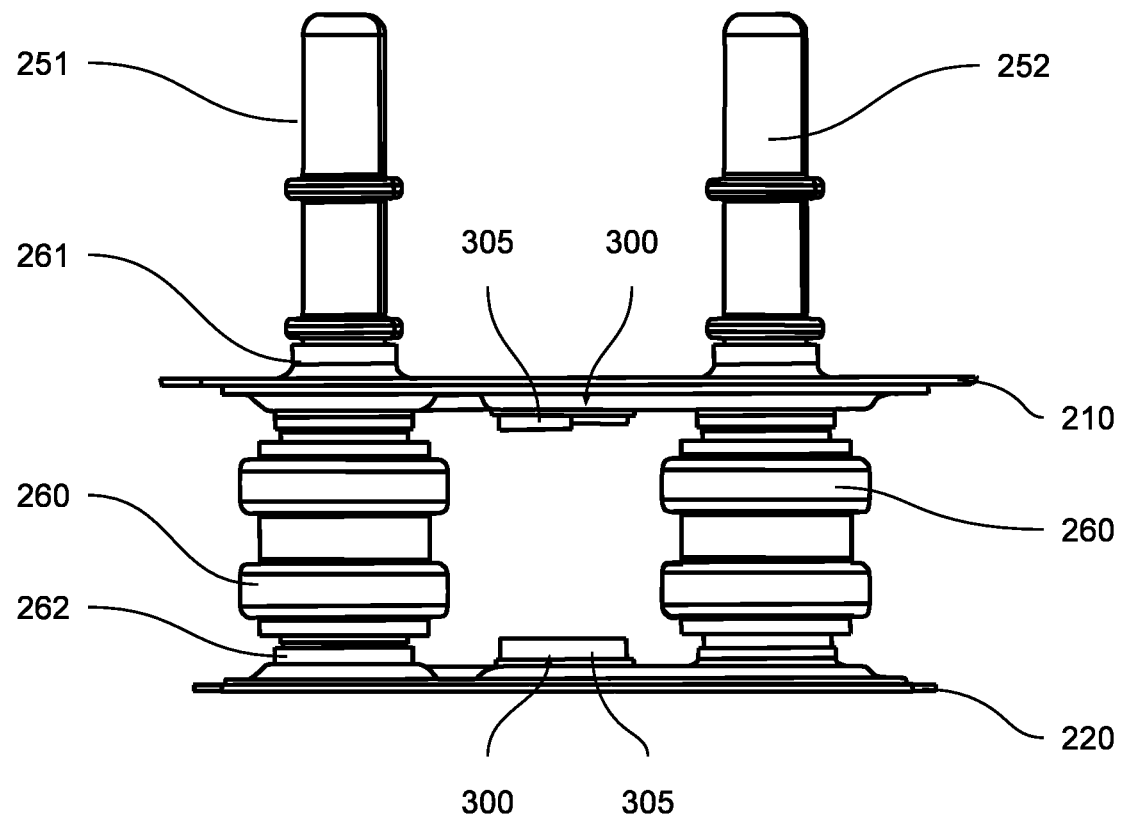
FIG. 17 shows a heat exchanger in a side view.

FIG. 17 shows the heat exchanger 200 of FIGS. 10 and 11 in a side view. The primary tube 210 and the terminal tube 220 can be connected by interconnectors 260 to mechanically fix one to another and to enable heat exchange fluid to travel therebetween. In particular, the fluid openings 250 of the primary tube 210 and the terminal tube 220 (shown in FIGS. 18 and 19) are connected by interconnectors 260 to enable fluid flow therebetween. In the shown embodiment, there are two interconnectors 260. One of the interconnectors 260 can be associated with introducing the heat exchange fluid to the primary tube 210 and the terminal tube 220, while the other interconnector 260 can be associated with egressing the heat exchange fluid from the primary tube 210 and the terminal tube 220. An inlet spigot 251 can be attached to the primary tube 210 and communicated with the interconnector 260 for introducing the heat exchange fluid into the primary tube 210. An outlet spigot 252 can be attached to the primary tube 210 and communicated with the interconnector 260 for egressing the heat exchange fluid from the primary tube 210.

The primary tube 210 can include collars to receive the inlet and outlet spigots 251, 252, in particular flat tube collars 261 located on the first flat tube 210, which in such case would be facing the inlet and outlet spigots 251, 252.

The primary tube 210 and the terminal tube 220 can include collars to receive the interconnectors 260, in particular the first and second shaped plates 211, 221 can include shaped plate collars 262, which in such case would be facing the interconnectors 260.

As can be seen in FIG. 17, the first and second shaped plates 212, 222 include attachments 300 with their contact portions 305. In this embodiment, as the first and second shaped plates 212, 222 are facing each other, and so are their respective attachments 300.

FIG. 18 shows an example of a primary tube 210. The primary tube 210 includes a first fluid channel 213 to guide the heat exchange fluid through the primary tube 210. The primary tube 210 includes fluid openings 250 for introducing and egressing the heat exchange fluid from the primary tube 210.

Preferably, one end of the first fluid channel 213 has two fluid openings 250 for enabling the fluid flow to the primary tube 210, while the other end of the first fluid channel 213 has two fluid openings 250 for enabling the fluid flow out of the primary tube 210 (on both sides of the primary tube 210). In such case, each pair of fluid openings 250 includes one fluid opening 250 in the first flat plate 211 and one fluid opening 250 in the first shaped plate 212.

In the shown embodiment, the first fluid channel 213 forms a U-flow path having a first arm 214 and a second arm 215. The fluid openings 250 can be arranged at the opposite ends of the U-flow path.

In relation to FIG. 19 and the terminal tube 220, the second fluid channel 223 can form a U-flow path having a first arm 214 and a second arm 215. The fluid openings 250 can be arranged at the opposite ends of the U-flow path. The U-flow path of the primary tube 210 can have a different length than the U-flow path of the terminal tube 220. In general, the primary tube 210 can be shorter than the terminal tube 220. The primary tube 210 can be longer than the terminal tube 220. The primary tube 210 can also be of the same length as the terminal tube 220.

The first arm 214 can be split into at least two parallel sub-conduits 216. The second arm 215 can be formed by a single conduit 217. The split can be used to help balance the flow in the plate. It can also focus the flow to specific got spots to achieve better heat transfer coefficient.

The first arm 214 can be separated from the second arm 215 by a first wall 253 extending away from the ends of the U-flow path. The at least two sub-conduits 216 can be separated from each other by a second wall 254 extending away from the ends of the U-flow path. The first wall 253 can extend farther away from the ends of the U-flow path than the second wall 254. This as well can help management of the heat exchange as explained above. Preferably, the at least two parallel sub-channels 216 terminate in common fluid openings 250.

In the shown embodiment, the first shaped plate 212 can include a stamped depression 218 forming together with the surface of the first flat plate 211 the first fluid channel 213. The stamped depression 218 can have a flat surface at the bottom, located away from the first flat plate 211.

FIG. 19 shows an example of a terminal tube 220. The terminal tube 220 includes a second fluid channel 223 to guide the heat exchange fluid throughout the terminal tube 220. The terminal tube 220 includes fluid openings 250 for introducing and egressing the heat exchange fluid from the terminal tube 220.

Preferably, one end of the second fluid channel 223 has two fluid openings 250 for enabling the fluid flow to the terminal tube 220, while the other end of the second fluid channel 223 has two fluid openings 250 for enabling the fluid flow out of the terminal tube 220. In such case, each pair of fluid openings 250 includes one fluid opening 250 in the second flat plate 221 and one fluid opening 250 in the second shaped plate 222.

In the shown embodiment, the second fluid channel 223 forms a U-flow path having a first arm 214 and a second arm 215. The fluid openings 250 can be arranged at the opposite ends of the U-flow path.

The second fluid channel 223 can form a U-flow path having a first arm 214 and a second arm 215. The fluid openings 250 can be arranged at the opposite ends of the U-flow path.

The first arm 214 can be split into at least two parallel sub-conduits 216. The second arm 215 can be formed by a single conduit 217.

The first arm 214 can be separated from the second arm 215 by a first wall 253 extending away from the ends of the U-flow path. The at least two sub-conduits 216 can be separated from each other by a second wall 254 extending away from the ends of the U-flow path. The first wall 253 can extend farther away from the ends of the U-flow path than the second wall 254. Preferably, the at least two parallel sub-channels 216 terminate in common fluid openings 250.

In the shown embodiment, the second shaped plate 222 can include a stamped depression 218 forming together with the surface of the second flat plate 221 the second fluid channel 223. The stamped depression 218 can have a flat surface at the bottom, located away from the second flat plate 221.

In the shown embodiment, the second shaped plate 222 includes fluid openings 250 for the fluid to enable fluid flow to and from the terminal tube 220, while the second flat plate 221 lacks any fluid openings 250 for the fluid.

As described above, an inlet spigot 251 and an outlet spigot 252 for the heat exchange fluid can be attached to the openings 250 of the primary tube 210.

Figure 20:
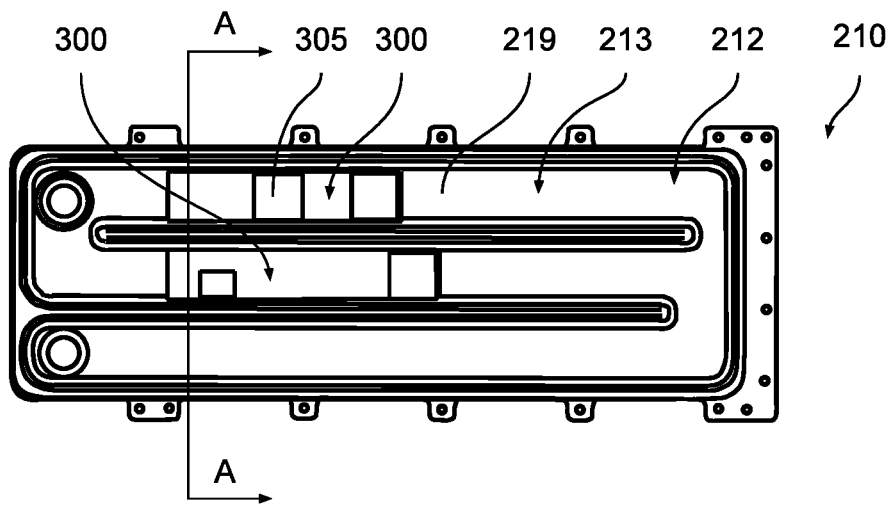
FIG. 20 shows an example of a primary tube with attachments.
Figure 22:
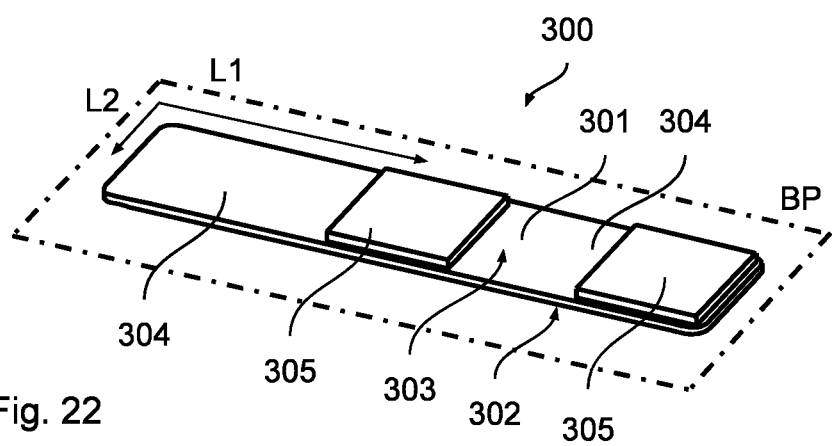
FIG. 22 shows another example of an attachment.

FIG. 20 shows an example of a primary tube 210 with attachments 300. The primary tube 210 includes the first shaped plate 212, which allows defining the first fluid channel 213 together with the first flat plate 211. In general, the first fluid channel 213 can have a channel wall 219 formed by any heat exchange plate 201, in this case the first shaped plate 212. One or more attachments 300 can be attached to that channel wall 219. The attachment 300 generally has a bottom side 302 and a top side 303 (as shown in FIG. 22). The attachment 300 can be connected to the channel wall 219 by the bottom side 302.

The attachment 300 can have a single contact portion 305 or a plurality of contact portions 305 extending away from a top side 303, preferably independently from each other. By a contact portion 305 it is here understood a dedicated part of the attachment 300 intended to be in contact with a specific heat source so that heat can be exchanged therebetween in a facilitated manner. It is intended for the contact portion 305 to receive bulk of the energy from the heat source as opposed to sections of the attachment 300 where contact portion 305 is not present.

As shown in FIGS. 20-28, the attachment 300 has an attachment base plate 301 extending within a base plane BP. A thickness T is defined as extending between the bottom side 302 and the top side 303 between of the attachment base plate 301. The attachment base plate 301 can be of rectangular, elongated outline extending along an attachment longitudinal axis L1 and an attachment lateral axis L2, the extension along the attachment longitudinal axis L1 being predominant.

Figure 21:
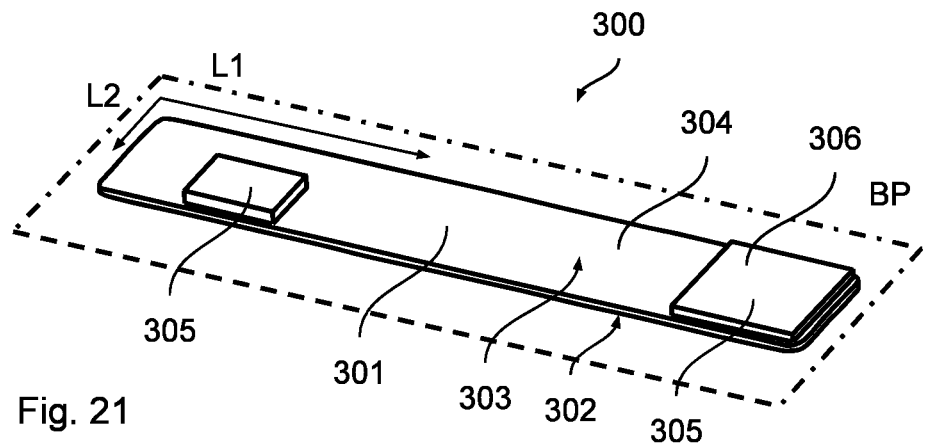
FIG. 21 shows an example of an attachment.

FIG. 21 shows an example of an attachment 300, with two contact portions 305. Contact portions 305 extend away from the top side 303 perpendicularly to the base plane BP.

In one embodiment, the attachment base plate 301 and the contact portions 305 are a single machined piece. Alternatively, the contact portions 305 can be connected to the attachment base plate 301 by means of an adhesive. Preferably, the plurality of contact portions 305 are made of a solid material. Preferably, the attachment 300 is made of a material of high thermal conductivity. Preferably, the attachment 300 and the contact portions 305 are made of metal. In such case, the contact portions 305 can be connected to the attachment base plate 301 by brazing.

In the shown embodiment, there is a distancing section 304 between the contact portions 305. Here, the distancing section 304 is a region of the base plate 301, in particular of its top side 303, where the contact portions 305 are not present. The distancing section 304 can allow to reduce the amount of material needed for the attachment 300 in areas more remote with respect to heat sources than the contact portions 305. The distancing sections 304 however, in particular the region of the attachment base plate 301 at its bottom side 302, can contribute to secure connection of the attachment 300 to any heat exchange plate 201 (in these cases a first flat plate 211, a first shaped plate 212, a second flat plate 221, a second shaped plate 222), as sufficient contact surface between the attachment 300 and said heat exchange plate 201 is ensured.

In any case, it is preferable for the contact portions 305 to have a contact surface adapted for intermediate surface of a heat source that they are intended to face to maximize heat exchange efficiency. Preferably, the contact portions 305 have flat top contact surface 306, especially when they are matched with integrated circuits, which themselves tend to have flat surfaces.

Figure 25:
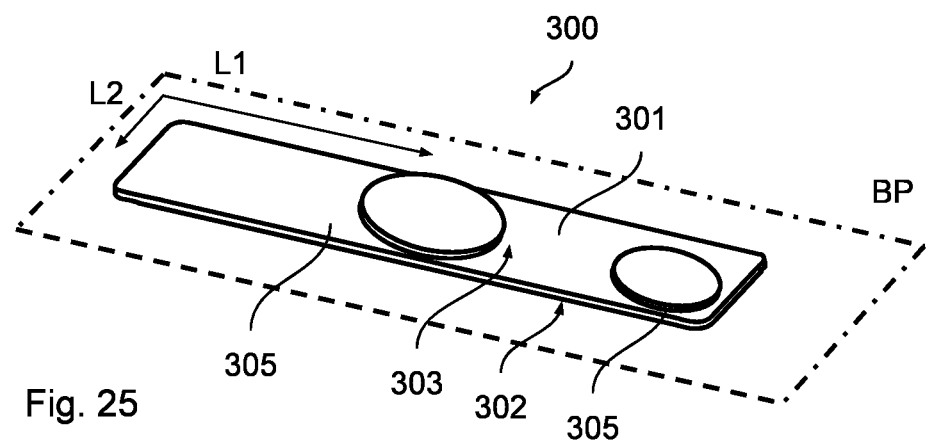
FIG. 25 shows another example of an attachment.

Any contact portion 305 can have a rectangular outline, e.g. square outline (as shown in FIGS. 21, 22) or a rounded outline, e.g. oval or circular (as shown in FIG. 25), the outline extending in its width and length dimensions.

FIG. 22 shows another example of an attachment 300. In this case, the two contact portion 305 are identical to each other and are separated by a distancing section 304. It is worth noting that the distancing section 304 can be present between any contact portion 305 and an edge of the attachment base plate 301, not only strictly between the contact portions 305.

Figure 23:
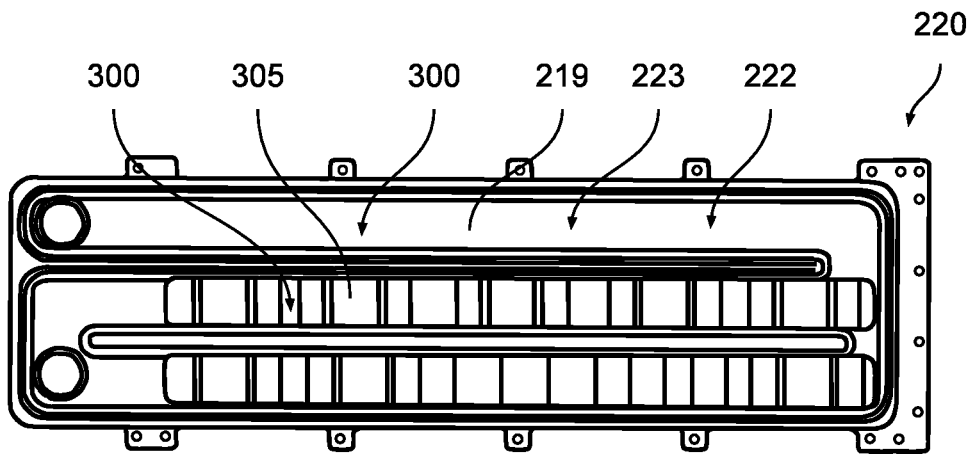
FIG. 23 shows an example of a terminal tube with attachments.

FIG. 23 shows an example of a terminal tube 220 with attachments 300. The terminal tube 220 includes the second shaped plate 222, which allows defining the second fluid channel 223 together with the second flat plate 221. In general, the second fluid channel 223 can have a channel wall 219 formed by any heat exchange plate 201, in this case the second shaped plate 222. One or more attachments 300 can be attached to that channel wall 219, for example analogously to how it was described earlier in relation to the primary tube 210.

Figure 24:
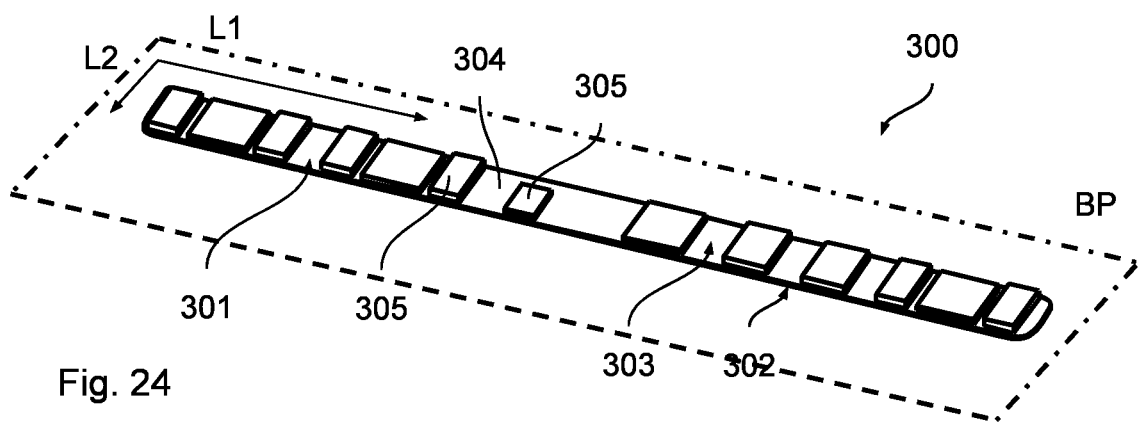
FIG. 24 shows another example of an attachment.

FIG. 24 shows another example of an attachment 300. In this case, the attachment 300 for a terminal tube 220 is presented, including a plurality of contact portions 305. The presented contact portions 305 can differ from each other in terms of size and shape to accommodate differently shaped and sized heat sources, in this case the third heat sources 431. The nature of envisaged differentiation will be explained in relation to following figures.

Figure 26:
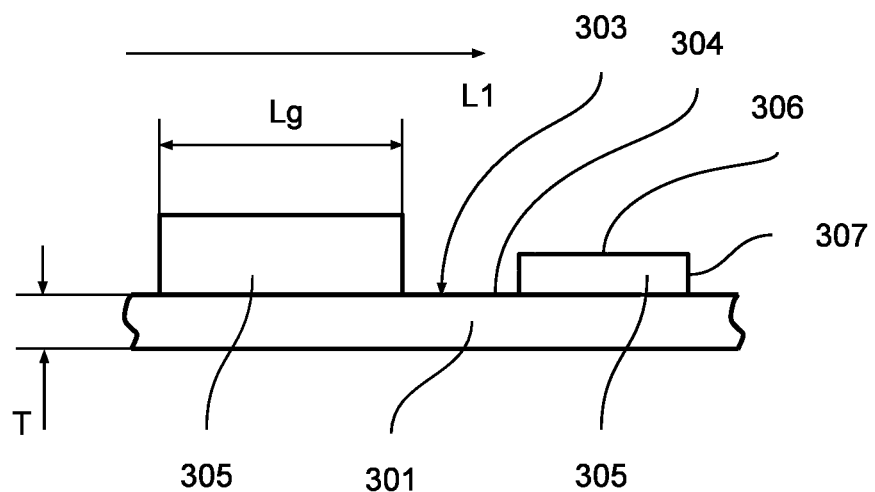
FIG. 26 shows a partial side view of an attachment in detail.

FIG. 26 shows schematically a partial side view of an attachment 300 of FIG. 24 in detail. The top side 303 can have a distancing section 304 between neighboring contact portions 305, the distancing section 304 maintaining the thickness T.

In one embodiment, at least one contact portion 305 extends from the attachment base plate 301 farther than another contact portion 305. In other words, one contact portion 305 can have different height than another contact portion 305.

In one embodiment, at least one contact portion 305 has a different longitudinal length Lg than another contact portion 305, the longitudinal length Lg being measured along the attachment longitudinal axis L1.

The top side 303 of the attachment base plate 301 and the flat top contact surfaces 306 of the contact portions 305 can be connected by side walls 307 of the contact portions 305, the side walls 307 being perpendicular to the top side 303 and the flat top contact surfaces 306. Alternatively, the side walls 307 can be oblique with respect to the top side 303 and/or the flat top contact surfaces 306.

Figure 27:
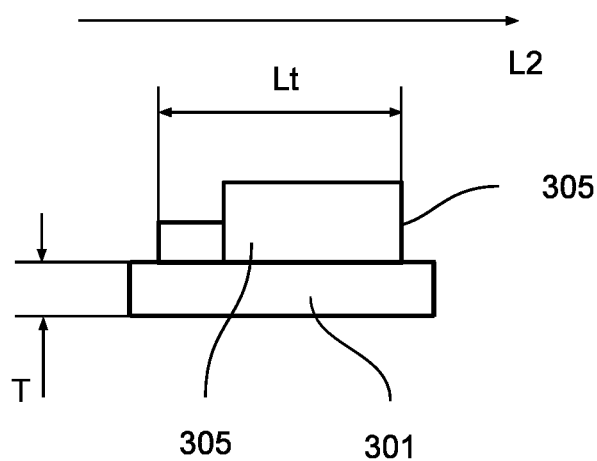
FIG. 27 shows another side view of an attachment in detail.

FIG. 27 shows schematically another side view of an attachment 300 in detail of FIG. 24 in detail. At least one contact portions 305 can have a different lateral length Lt than another contact portion 305, the lateral length Lt being measured along the attachment lateral axis L2.

Figure 28:
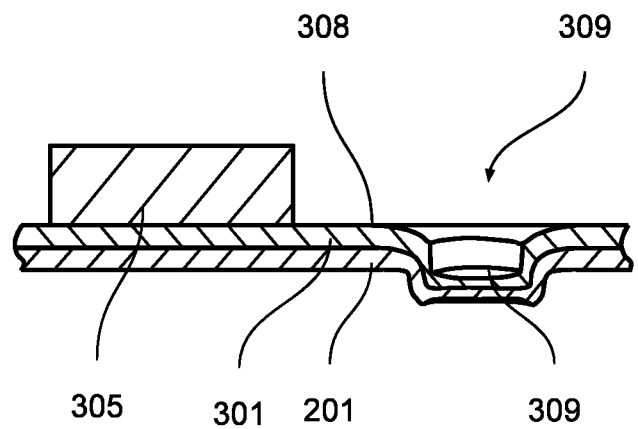
FIG. 28 shows an example of a partial cross-sectional view of a shaped plate with an attachment.

FIG. 28 shows schematically an example of a partial cross-sectional view of a heat exchange plate 201 with an attachment 300. The attachment base plate 301 can have connection section 308 adapted for clinching. As explained earlier, the top side 303 of the attachment base plate 301 can have a distancing section 304 between the contact portions 305, the distancing section 304 maintaining the thickness T of the attachment base plate 301. The attachment base plate 301 can be clinched to the channel wall 219 of any heat exchange plate 201 (e.g. the first flat plate 211, the first shaped plate 212, the second flat plate 221, the second shaped plate 222) at the distancing section 304 by a clinched connection 309. Such clinched connection 309 may be an intermediate step for connecting the attachment 300 to any heat exchange plate 201, which subsequently can be finally fixed by means of brazing. In such case, the clinched connection 309 serves to position the components in relation to one another so that the brazing process can be efficiently performed.

Figure 29:
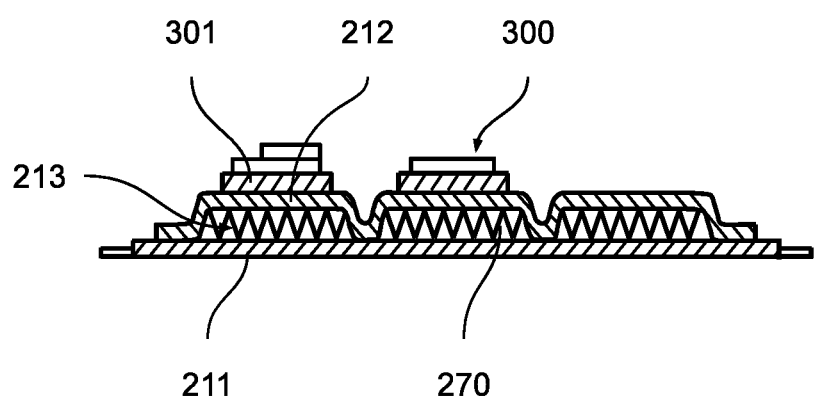
FIG. 29 shows a cross-section view of the primary tube of FIG. 20.

FIG. 29 shows a cross-section view of the primary tube 210 of FIG. 20. A turbulator 270 for improving heat exchange efficiency can be placed within the first fluid channel 213. It can be present in select arms 214 or conduits 217 or sub-conduits 216 of the first fluid channel 213, or can fill them all at the same time. The same applies mutatis mutandis to the terminal tube 220 or other tubes if present.

Other variations to the disclosed embodiments can be understood and effected by those skilled in the art in practicing the claimed invention, from a study of drawings, the disclosure, and the appended claims. The mere fact that certain measures are recited in mutually different dependent claims does not indicate that a combination of these measures cannot be used to the advantage.

The invention claimed is:

1. A heat exchanger assembly, comprising:
a heat exchanger with a primary tube including a first fluid channel for a heat exchange fluid;
a first heat source module with a plurality of first heat sources; and
an attachment with a plurality of contact portions exposed to the plurality of first heat sources, mounted on the primary tube adjacent to the first fluid channel;
wherein the heat exchanger includes a terminal tube including a second fluid channel for a heat exchange fluid, connected fluidically to the primary tube,
with the primary tube and the terminal tube being connected by one or more interconnectors enabling fluid flow therebetween,
wherein the heat exchanger assembly further comprises a chassis to which the heat exchanger and the first heat source module are attached, wherein the chassis includes a housing defining an internal volume in which the first heat source module is located,
wherein the primary tube extends across and contacts a first external surface of the housing, the terminal tube extends across and contacts a second external surface of the housing, wherein the first external surface opposes the second external surface, and the one or more interconnectors are located externally with respect to the housing, wherein the housing has an interconnector cut-out at least partially enveloping the interconnector.

2. The heat exchanger assembly according to claim 1, wherein the first heat source module is a PCB board, the first heat sources being integrated circuits.

3. The heat exchanger assembly according to claim 1, wherein the housing has a primary slot for the primary tube at least partially enveloping the primary tube.

4. The heat exchanger assembly according to claim 1, wherein the housing has a primary separation wall between the primary tube and the first heat source module, wherein the primary separation wall includes a primary attachment opening through which the attachment protrudes.

5. The heat exchanger assembly according to claim 1, further comprising a second heat source module with a second heat source, in contact with the primary tube, wherein the primary tube is sandwiched between the first heat source module and the second heat source module.

6. The heat exchanger assembly according to claim 5, wherein the primary tube includes a first flat plate and a first shaped plate connected to each other to form a first fluid channel, wherein the second heat source module is abutting the first flat plate.

7. The heat exchanger assembly according to claim 5, wherein the second heat source module is in form of a cartridge encapsulating the second heat source.

8. The heat exchanger assembly according to claim 5, wherein the second heat source is an integrated circuit.

9. The heat exchanger assembly according to claim 5, wherein the second heat source module is attached to the chassis externally with respect to the housing.

10. The heat exchanger assembly according to claim 1, further comprising a third heat source module with a plurality of third heat sources.

11. The heat exchanger assembly according to claim 10, further comprising a fourth heat source module with a fourth heat source, in contact with the terminal tube, wherein the terminal tube is sandwiched between the third heat source module and the fourth heat source module.

12. The heat exchanger assembly according to claim 1, wherein the terminal tube is located externally with respect to the housing.

13. The heat exchanger assembly according to claim 1, wherein the housing has a terminal slot for the terminal tube at least partially enveloping the terminal tube.

14. The heat exchanger assembly according to claim 1, wherein the terminal tube includes an attachment with a plurality of contact portions exposed to the plurality of third heat sources, mounted on the terminal tube adjacent to the second fluid channel.

15. The heat exchanger assembly according to claim 14, wherein the housing has a terminal separation wall between the terminal tube and the third heat source module, wherein the terminal separation wall includes a terminal attachment opening through which the attachment of the terminal wall protrudes.

16. A heat exchanger assembly, comprising:
a heat exchanger with a primary tube including a first fluid channel for a heat exchange fluid;
a first heat source module extending parallel with the primary tube, the first heat source module including a plurality of first heat sources; and
an attachment with a plurality of contact portions exposed to the plurality of first heat sources, mounted on the primary tube adjacent to the first fluid channel;
wherein the heat exchanger includes a terminal tube disposed beneath the first heat source module and including a second fluid channel for a heat exchange fluid, connected fluidically to the primary tube, with the primary tube and the terminal tube being connected by one or more interconnectors enabling fluid flow therebetween;
wherein the heat exchanger assembly further comprises a chassis to which the heat exchanger and the first heat source module are attached, wherein the chassis includes a housing defining an internal volume in which the first heat source module is located;
wherein the primary tube, the terminal tube and the one or more interconnectors are located externally with respect to the housing, and wherein the housing has an interconnector cut-out at least partially enveloping the interconnector.

17. The heat exchanger assembly according to claim 16, wherein the housing has a primary slot for the primary tube at least partially enveloping the primary tube.

18. The heat exchanger assembly according to claim 16, wherein the housing has a primary separation wall between the primary tube and the first heat source module, wherein the primary separation wall includes a primary attachment opening through which the attachment protrudes.

19. The heat exchanger assembly according to claim 16, further comprising a second heat source module with a second heat source, in contact with the primary tube, wherein the primary tube is sandwiched between the first heat source module and the second heat source module.

20. A heat exchanger assembly, comprising:
a heat exchanger with a primary tube including a first fluid channel for a heat exchange fluid;
a first heat source module extending parallel with the primary tube, the first heat source module including a plurality of first heat sources; and
an attachment with a plurality of contact portions exposed to the plurality of first heat sources, mounted on the primary tube adjacent to the first fluid channel;
wherein the heat exchanger includes a terminal tube including a second fluid channel for a heat exchange fluid, connected fluidically to the primary tube, with the primary tube and the terminal tube being connected by one or more interconnectors enabling fluid flow therebetween;
wherein the heat exchanger assembly further comprises a chassis to which the heat exchanger and the first heat source module are attached, wherein the chassis includes a housing defining an internal volume in which the first heat source module is located;
wherein the primary tube, the terminal tube and the one or more interconnectors are located externally with respect to the housing, and wherein the housing has an interconnector cut-out at least partially enveloping the interconnector.

* * * * *